(12) United States Patent
Haga et al.

(10) Patent No.: US 7,077,696 B2
(45) Date of Patent: Jul. 18, 2006

(54) CONNECTOR WHICH CAN EASILY BE MOUNTED TO AN OBJECT AND PROVIDED WITH EMI PROTECTION

(75) Inventors: Goro Haga, Tokyo (JP); Kenichi Kotaka, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 0 days.

(21) Appl. No.: 11/086,157

(22) Filed: Mar. 22, 2005

(65) Prior Publication Data

US 2005/0221656 A1 Oct. 6, 2005

(30) Foreign Application Priority Data

Mar. 30, 2004 (JP) .............................. 2004-098649

(51) Int. Cl.
*H01R 13/73* (2006.01)
*H02B 1/01* (2006.01)
(52) U.S. Cl. ...................................... 439/553; 439/939
(58) Field of Classification Search ................ 439/553, 439/552, 939
See application file for complete search history.

(56) References Cited

U.S. PATENT DOCUMENTS

| 3,128,138 | A | * | 4/1964 | Noschese ..................... 439/579 |
| 3,366,918 | A | * | 1/1968 | Johnson et al. ............. 439/607 |
| 4,386,814 | A | * | 6/1983 | Asick .......................... 439/607 |
| 6,033,263 | A | * | 3/2000 | Weidler et al. ............. 439/620 |
| 6,231,356 | B1 | * | 5/2001 | Stutts et al. .................. 439/92 |
| 6,280,257 | B1 | * | 8/2001 | North et al. ................ 439/680 |
| 6,513,206 | B1 | | 2/2003 | Banitt et al. |
| 6,659,796 | B1 | * | 12/2003 | Waddell et al. ............. 439/557 |

* cited by examiner

*Primary Examiner*—Hae Moon Hyeon
(74) *Attorney, Agent, or Firm*—Frishauf, Holtz, Goodman & Chick, P.C.

(57) ABSTRACT

In a connector including a connector element to be connected to a mating connector in a predetermined direction, a ring-shaped guide member is engaged with the connector element in the predetermined direction to receive the mating connector. The guide member has a spring portion which is formed on its inner surface and is adapted to be pressed by the mating connector in a radially outward direction. The spring portion serves to stabilize the mating connector.

14 Claims, 10 Drawing Sheets

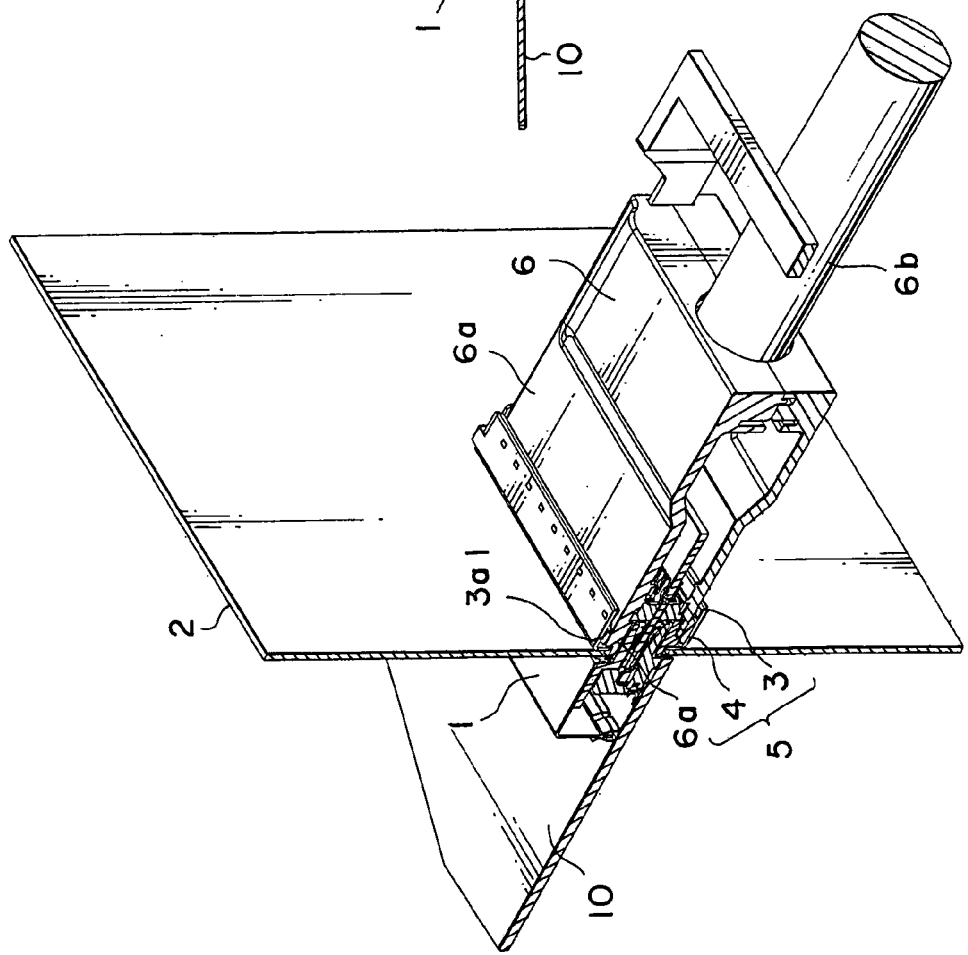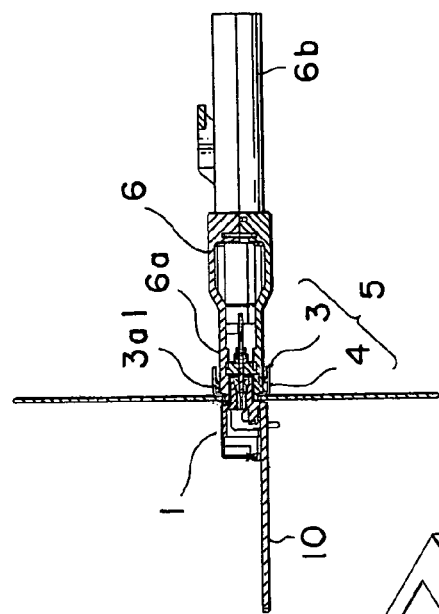

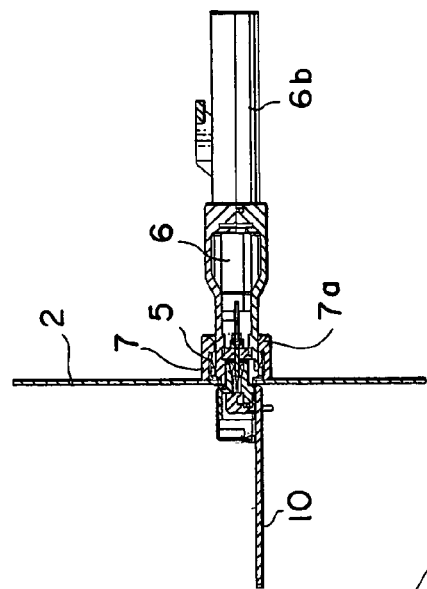
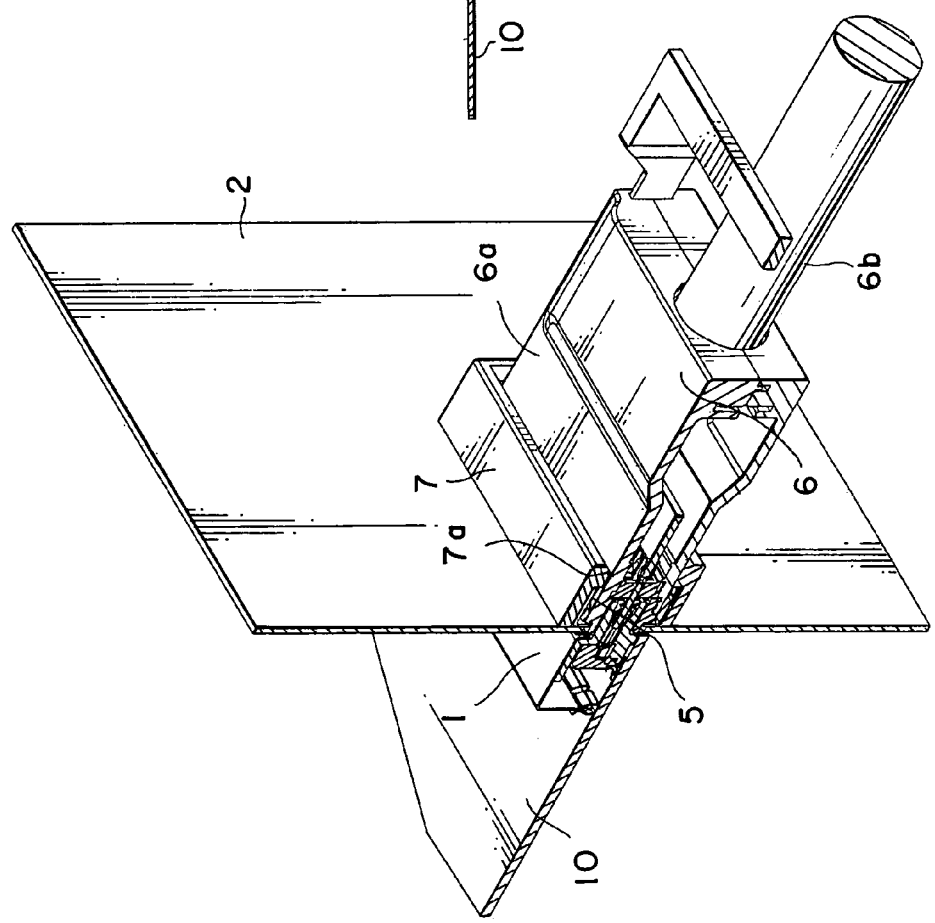
FIG. 10A
FIG. 10B

CONNECTOR WHICH CAN EASILY BE MOUNTED TO AN OBJECT AND PROVIDED WITH EMI PROTECTION

This application claims priority to prior Japanese patent application JP 2004-98649, the disclosure of which is incorporated herein by reference.

BACKGROUND OF THE INVENTION

This invention relates to a connector adapted to be mounted to an object such as a panel of a housing or casing.

In a connector of this type, a receptacle connector is generally fixed to a panel by fastening and tightening a screw. Such technique is adopted in most input/output (I/O) connectors for computers. However, a space for a screw structure is required and a fixing operation is troublesome.

In U.S. Pat. No. 6,513,206, it is proposed to fix a receptacle connector to a panel of an electronic apparatus by the use of a retainer clip.

In the technique proposed in the above-mentioned United States Patent, a gap must be formed between the receptacle connector and the panel in order to insert the retainer clip. Therefore, it is difficult to bring the receptacle connector, the panel, and the retainer clip into tight contact with one another. Thus, presence of the gap may possibly result in generation of undesired radiation due to leakage of electromagnetic waves from the electronic apparatus. Further, a noise may possibly enter into the electronic apparatus to cause operation error of the electronic apparatus. Thus, there is a problem of electromagnetic interference (EMI).

SUMMARY OF THE INVENTION

It is therefore an object of this invention to provide a connector which can easily be mounted to an object such as a panel and which is provided with EMI protection.

Other objects of the present invention will become clear as the description proceeds.

According to an aspect of the present invention, there is provided a connector which comprises a connector element to be connected to a mating connector in a predetermined direction and a ring-shaped guide member engaged with the connector element in the predetermined direction to receive the mating connector, the guide member having a spring portion which is formed on its inner surface and is adapted to be pressed by the mating connector in a radially outward direction, the spring portion serving to stabilize the mating connector.

BRIEF DESCRIPTION OF THE DRAWINGS

FIG. 6A is a sectional perspective view of the state illustrated in FIG. 5;

FIG. 6B is a sectional side view of the state illustrated in FIG. 5;

FIG. 10A is a sectional perspective view of the state illustrated in FIG. 9; and FIG. 10B is a sectional side view of the state illustrated in FIG. 9.

DESCRIPTION OF THE PREFERRED EMBODIMENTS

Figure 1:
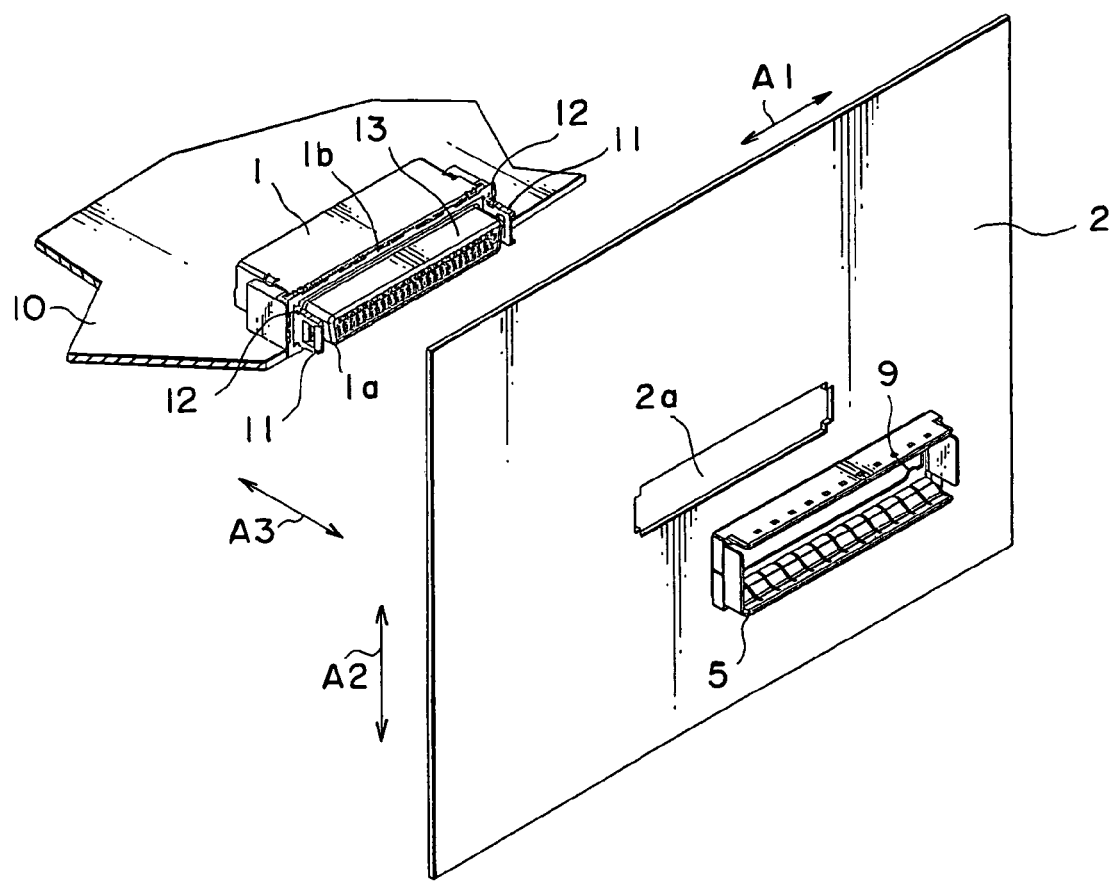
FIG. 1 is an exploded perspective view of a connector according to a first embodiment of this invention together with a panel.
Figure 2:
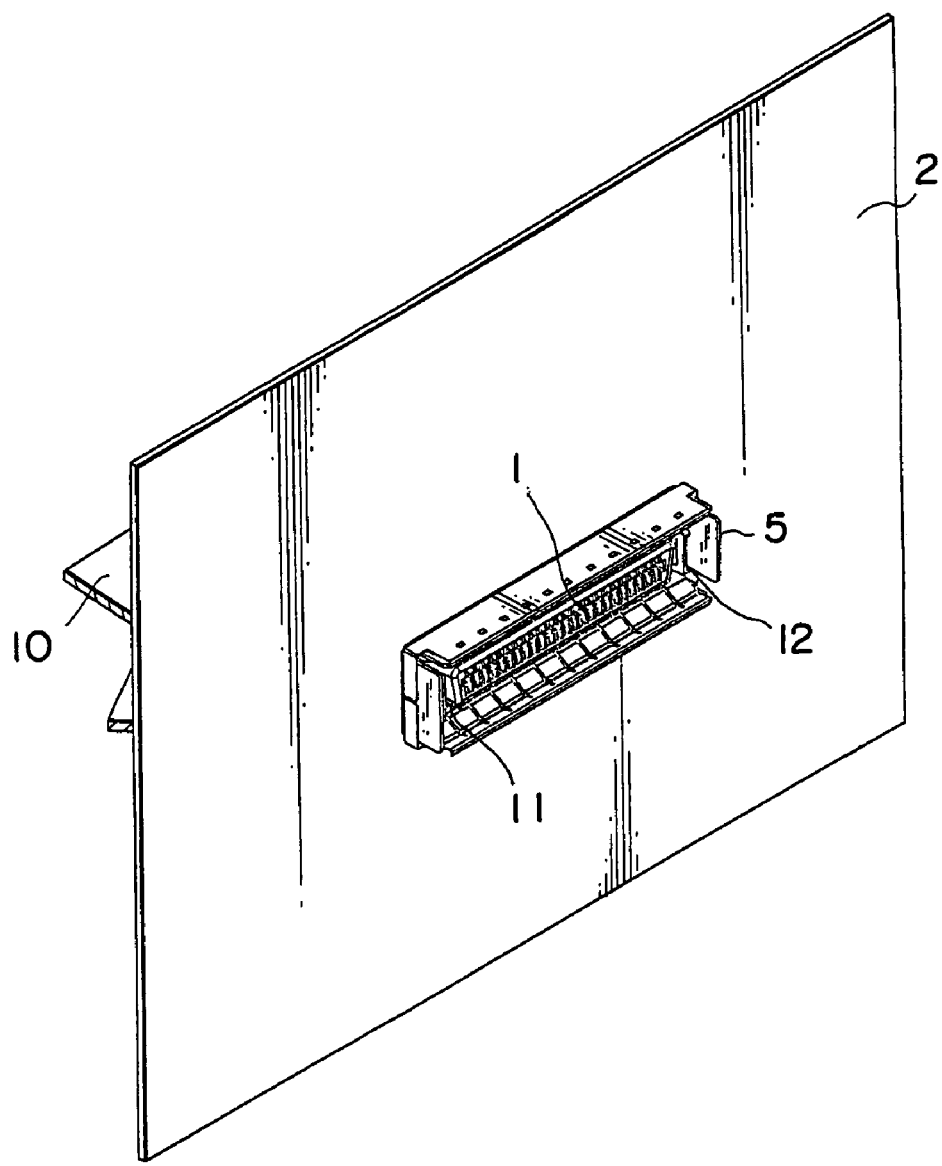
FIG. 2 is a perspective view of the connector in FIG. 1 when it is mounted to the panel.
Figure 3:
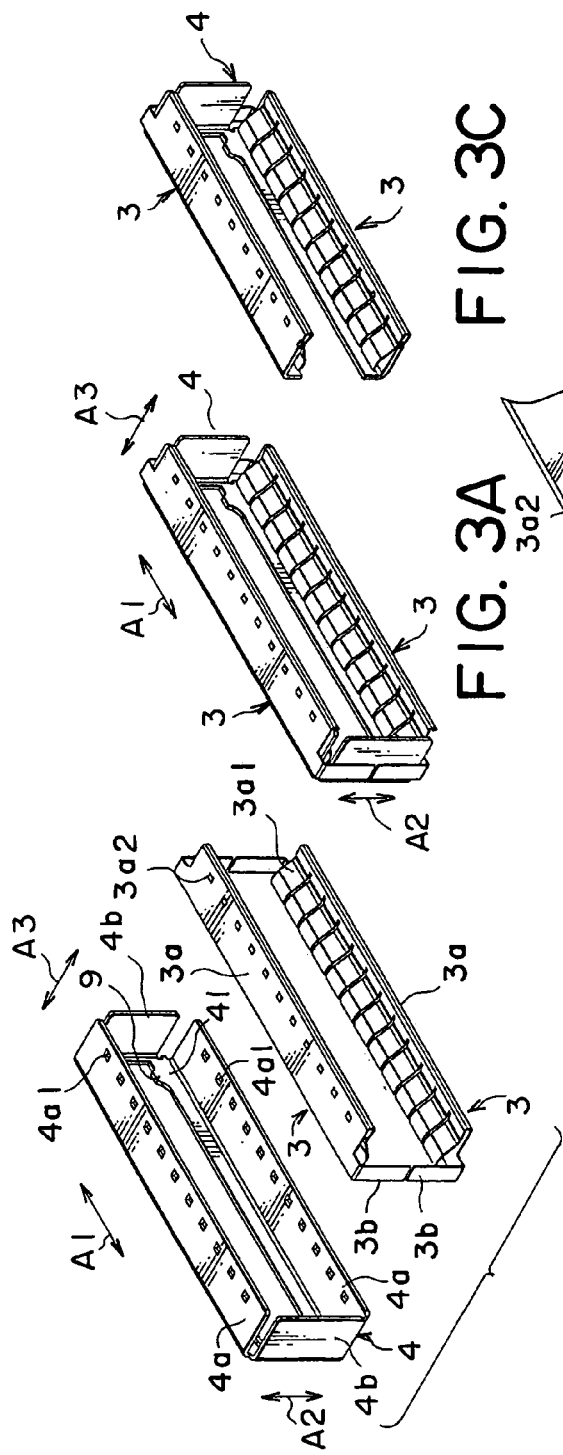
FIG. 3A is an enlarged perspective view of a guide member in the connector illustrated in FIG. 1.
FIG. 3B is an exploded perspective view of the guide member in FIG. 3A.
FIG. 3C is a perspective view of the guide member in FIG. 3A with a part removed.
FIG. 3D is an enlarged view of a characteristic part of the guide member illustrated in FIG. 3C.
Figure 4:
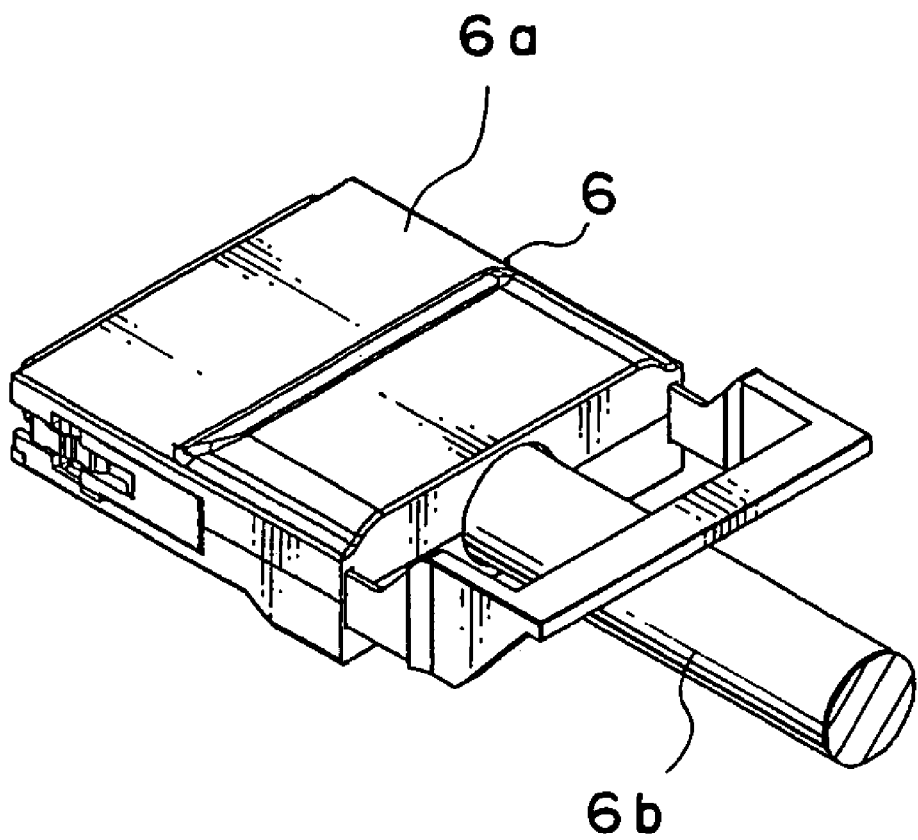
FIG. 4 is a perspective view of a mating connector.
Figure 5:
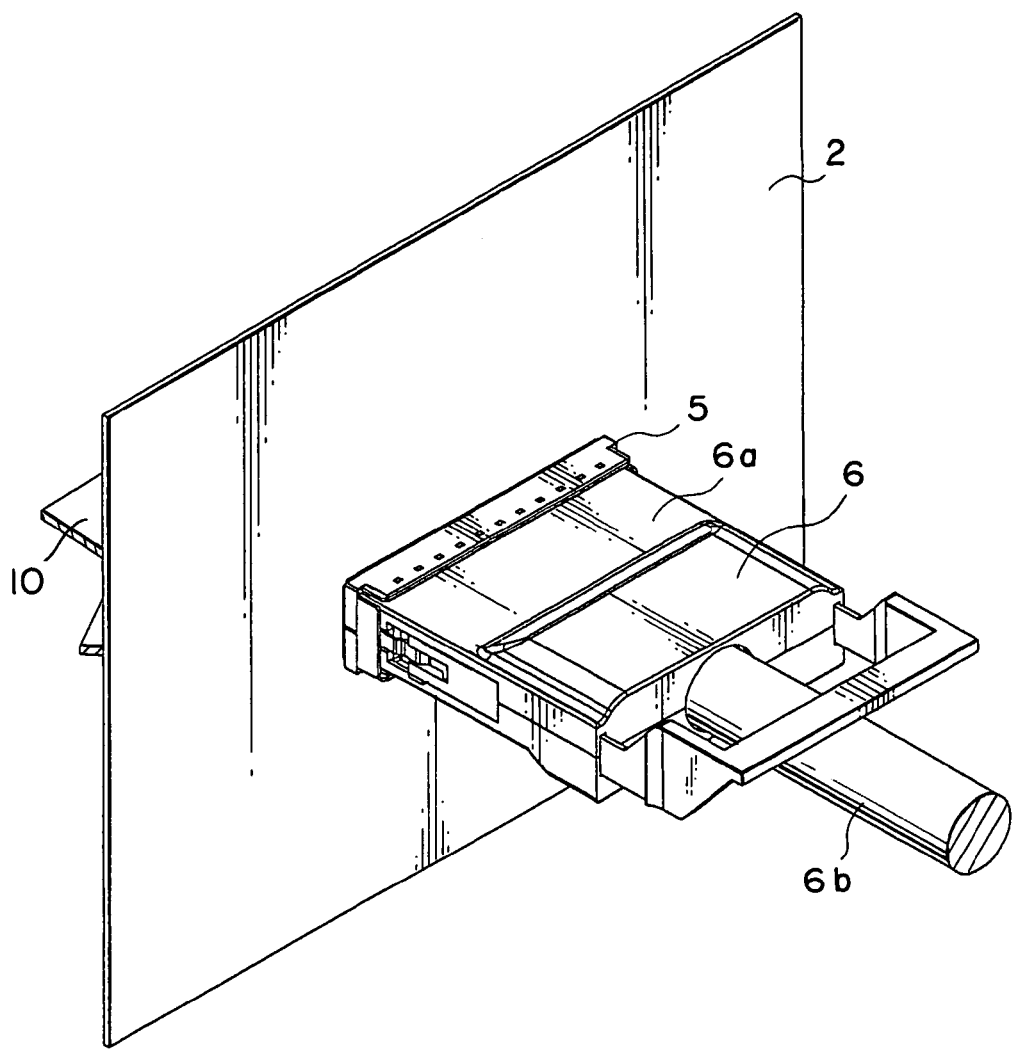
FIG. 5 is a perspective view showing a state where the mating connector is connected.
Figure 7:
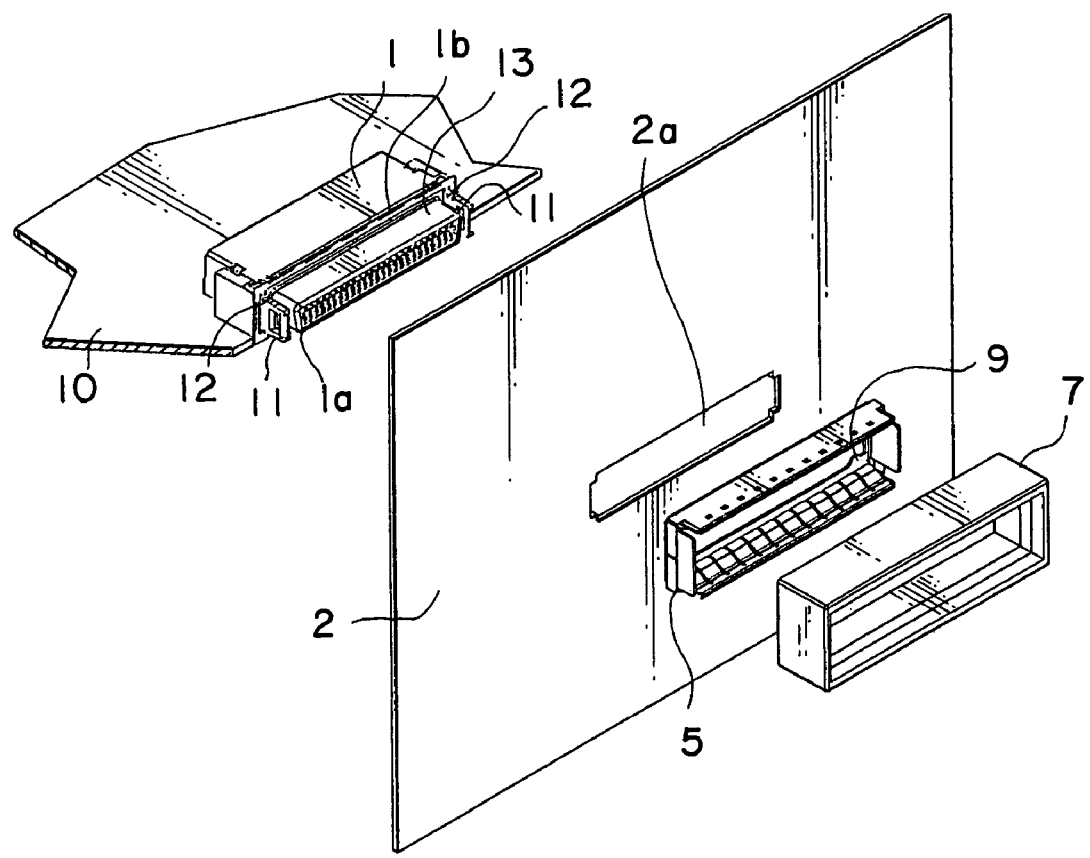
FIG. 7 is an exploded perspective view of a connector according to a second embodiment of this invention together with a panel.
Figure 8:
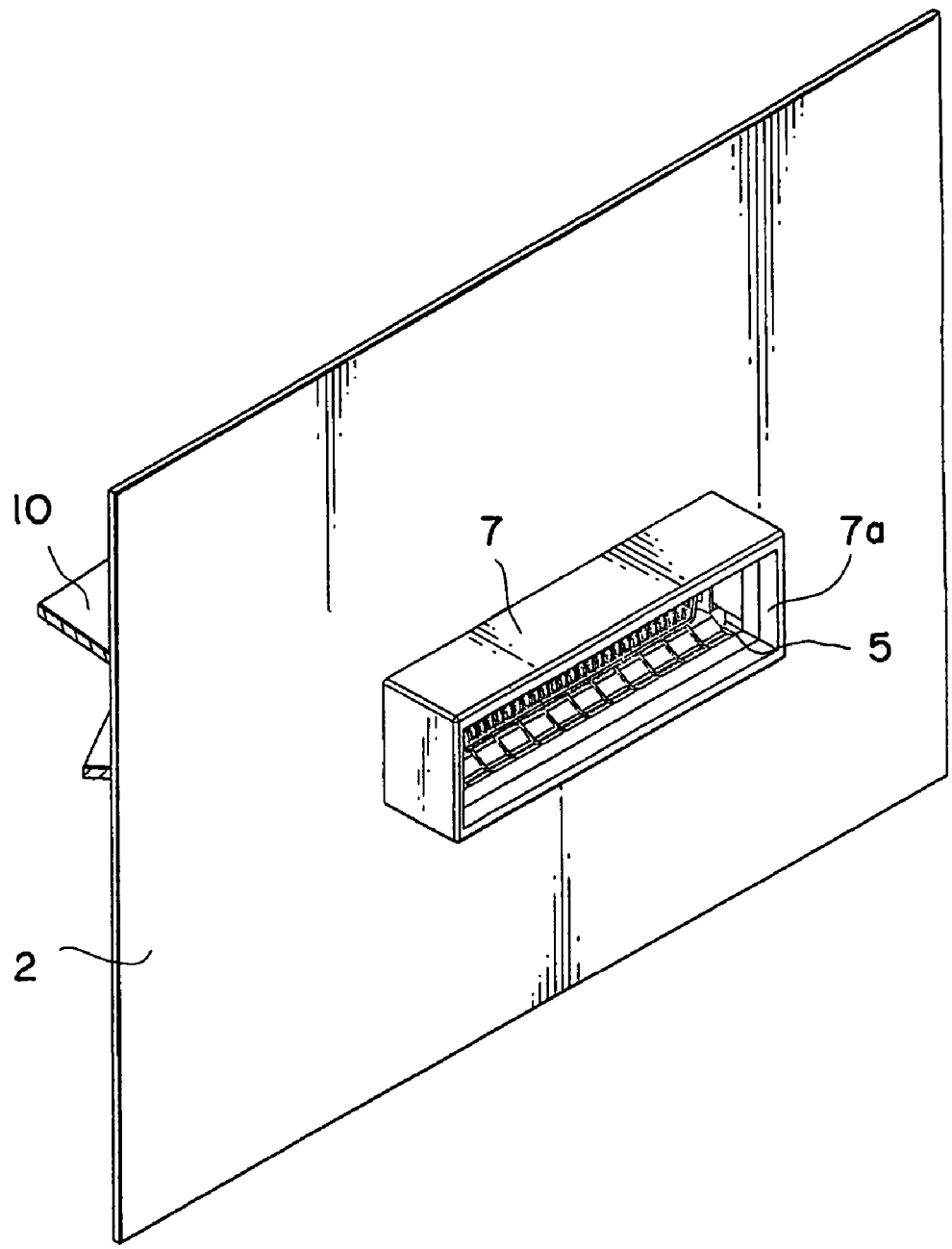
FIG. 8 is a perspective view of the connector in FIG. 7 when it is mounted to the panel.
Figure 9:
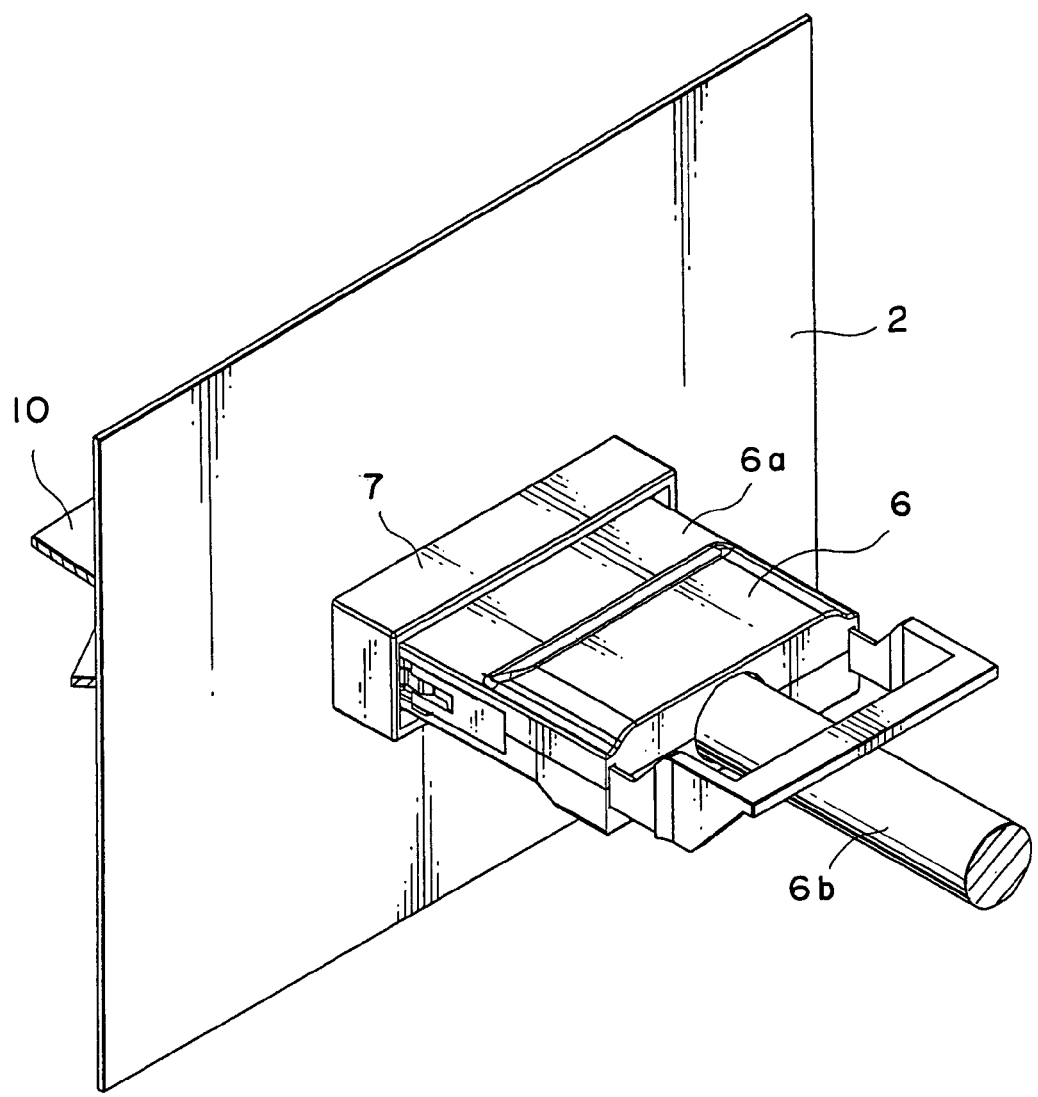
FIG. 9 is a perspective view showing a state where a mating connector is connected.

Referring to FIGS. 1 and 2, description will be made of a connector according to a first embodiment of this invention.

The connector illustrated in the figures is adapted to be mounted to a panel 2 of an electronic apparatus and is herein called a first connector. The first connector comprises a connector element 1 having a plurality of conductive contacts (not shown) and a guide member 5 having a rectangular ring shape. The connector element 1 is mounted to an edge portion of a printed circuit board 10 to be placed on a rear side of the panel 2. The guide member 5 is placed on a front side of the panel 2.

The connector element 1 has a connecting end portion 1a having a rectangular section defined by a conductive shell member 13, and two fixing plates 11 disposed at opposite ends of the connecting end portion 1a in a transversal direction (i.e., a first direction A1), respectively. Each of the fixing plates 11 is provided with a pair of engaging recesses 12 formed symmetrical in a vertical direction (i.e., a second direction A2).

The panel 2 has an opening 2a having a rectangular shape and slightly greater in size than the connecting end portion 1a. The connecting end portion 1a of the connector element 1 is inserted into the opening 2a and protrudes on the front side of the panel 2. The guide member 5 is coupled to an outside of the connecting end portion 1a and brought into contact with the panel 2.

The guide member 5 is provided with engaging claws 9 formed inside and symmetrical in the second direction A2. When the guide member 5 is coupled to the outside of the connecting end portion 1a, the engaging claws 9 are engaged with the engaging recesses 12 in a back-and-forth direction (i.e., a third direction A3), respectively. As a consequence, the panel 2 is clamped between a wall surface 1b of the connector element 1 and the guide member 5. Thus, the first connector is mounted to the panel 2. As a consequence, the guide member 5 is electrically connected to the connector element 1 and the panel 2.

Referring to FIGS. 3A to 3D, the guide member 5 will be described in detail.

The guide member 5 comprises a metal frame member (first member) 4 substantially entirely surrounding the connecting end portion 1a of the connector element 1, and two metal clip members (second and third members) 3 coupled to the frame member 4. The frame member 4 has a frame portion 41 of a generally rectangular ring shape, a pair of main plate portions 4a connected to opposite ends of the frame portion 41 in the second direction A2 and extending in the third direction A3, and a pair of subsidiary plate portions 4b connected to opposite ends of the frame portion 41 in the first direction A1 and extending in the third direction A3. The main plate portions 4a are faced to each other in the second direction A2. The subsidiary plate portions 4b are faced to each other in the first direction A1.

The clip members 3 are attached to the main plate portions 4a of the frame member 4, respectively. Each of the clip members 3 has a plate portion 3a faced to an outer surface of the main plate portion 4a, a number of tongue-shaped spring pieces 3a1 extending from the plate portion 3a, faced to an inner surface of the main plate portion 4a, and having elasticity, and a pair of side surface portions 3b having a narrow width and perpendicularly bent from opposite ends of the plate portion 3a in the first direction A1, respectively. The tongue-shaped spring pieces 3a1 are arranged in parallel to one another in the first direction A1. Each of the clip members 3 is fitted to the frame member 4 by inserting the main plate portion 4a of the frame member 4 between the plate portion 3a and the tongue-shaped spring pieces 3a1. As a consequence, the main plate portion 4a of the frame member 4 is clamped by the spring pieces 3a1 and the plate portion 3a of each clip member 3 in the second direction A2.

Each of the main plate portions 4a of the frame member 4 is provided with a number of holes 4a1 arranged in a single line in the first direction A1. On the other hand, the plate portion 3a of each clip member 3 is provided with a number of protrusions 3a2 arranged in a single line and protruding towards the spring pieces 3a1. When each clip member 3 is fitted to the frame member 4, the protrusions 3a2 are engaged with the holes 4a1, respectively. As a consequence, each clip member 3 is fixed to the frame member 4 to be electrically connected thereto.

Referring to FIGS. 4, 5, 6A, and 6B, description will be made of a second connector 6 as a mating connector and an operation of connecting the second connector 6.

The second connector 6 comprises a plurality of conductive contacts (not shown) arranged inside and a conductive shell member 6a. A cable 6b is connected to the contacts of the second connector 6.

The second connector 6 is fitted and connected to the connecting end portion 1a of the connector element 1 through the guide member 5. In this event, the spring pieces 3a1 of the clip members 3 are pressed by the second connector 6 to be elastically deformed and are brought into press contact with the shell member 6a of the second connector 6. Thus, the second connector 6 is guided by the spring pieces 3a1 towards the connector element 1 so that reliable and stable connection is established.

The second connector 6, the clip members 3, the frame member 4, the panel 2, and the connector element 1 are electrically connected to one another to serve as a ground of a circuit. The spring pieces 3a1 of the clip members 3 are arranged to surround an area around a connecting portion between the shell member 6a of the second connector 6 and the connector element 1 and, therefore, serve as a metal cage exhibiting a shielding function against electromagnetic radiation.

Referring to FIGS. 7 to 9, 11A, and 11B, description will be made of a connector according to a second embodiment of this invention. Similar parts are designated by like reference numerals and description thereof will be omitted.

The connector illustrated in the figures further comprises a frame-like structure member covering an entire circumference of the guide member 5. The frame-like structure member 7 covers the guide member 5 so as to simultaneously surround the connecting portion between the connector element 1 and the second connector 6. The frame-like structure member 7 made of metal exhibits a shielding function against electromagnetic radiation from both outside and inside of the area around the connecting portion between the connector element 1 and the second connector 6. Further, the frame-like structure member 7 serves to mechanically protect the area around the connecting portion between the connector element 1 and the second connector 6.

When the second connector 6 is fitted to the connector element 1, a chamfered portion 7a of the frame-like structure member 7 serves to guide the second connector 6. Therefore, the second connector 6 is properly fitted to the connector element 1.

In the foregoing description, the two clip members 3 as separate components are used. Alternatively, the clip members 3 may be integrally formed.

Further, the clip members 3 and the frame member 4 may be integrally formed into a single component.

Each clip member 3 is provided with a number of spring pieces 3a1 but may have a single spring piece.

In the foregoing description, each of the clip members 3, the frame member 4, and the frame-like structure member 7 is made of metal. Alternatively, each of the above-mentioned components may be formed by molding a conductive resin material. Further alternatively, each of the above-mentioned components may be formed by molding a resin material. In this case, a metal film is formed on the surface of each component by plating, vapor deposition, or the like. With this structure, the connector can be reduced in weight.

While this invention has thus far been described in connection with the preferred embodiments thereof, it will be readily possible for those skilled in the art to put this invention into practice in various other manners without departing from the scope set forth in the appended claims.

What is claimed is:

1. A connector comprising:
a connector element which is mounted to an object such that a connecting end portion of the connector element penetrates the object, so as to be connected to a mating connector in a predetermined direction; and
a substantially cylindrical guide member fitted to an outside of the connecting end portion to receive the mating connector;
wherein the guide member comprises:
at least one engaging claw to engage with the connector element in the predetermined direction so as to fix the connector element to the object; and
a spring portion which is provided on an inner surface of the guide member, which is adapted to be pressed by the mating connector in a radially outward direction, and which stabilizes the mating connector.

2. The connector according to claim 1, wherein the guide member electrically connects the object, the connector element, and the mating connector to one another.

3. The connector according to claim 1, wherein the connecting end portion has a rectangular exterior in cross-section, and the spring portion comprises a plurality of tongue-shaped spring pieces arranged in a circumferential direction of the connecting end portion.

4. The connector according to claim 3, wherein the guide member comprises:
a first member made of metal and substantially entirely surrounding the connecting end portion; and
a second member coupled to the first member;
wherein the tongue-shaped spring pieces are provided on the second member and extend inside the first member.

5. The connector according to claim 4, wherein the first member comprises a pair of plate-like portions facing each other with the connecting end portion interposed therebetween, and the second member is fitted and attached to a first one of the plate-like portions.

6. The connector according to claim 5, wherein the guide member further comprises an engagement structure engaging the first plate-like portion and the second member with each other.

7. The connector according to claim 6, wherein the engagement structure includes at least one hole formed in the first plate-like portion and at least one protrusion formed on the second member and inserted into the at least one hole.

8. The connector according to claim 5, wherein the guide member further comprises a third member fitted and attached to a second one of the plate-like portions, wherein the tongue-shaped spring pieces are provided on the third member and extend inside the first member.

9. The connector according to claim 8, wherein the guide member further comprises an engagement structure engaging the second plate-like portion and the third member with each other.

10. The connector according to claim 9, wherein the engagement structure includes at least one hole formed in the second plate-like portion and a protrusion formed on the third member and inserted into the at least one hole.

11. The connector according to claim 5, wherein the first member comprises a pair of additional plate portions formed between opposite ends of the plate-like portions and facing each other.

12. The connector according to claim 1, further comprising a frame-like structure member covering the guide member.

13. The connector according to claim 1, wherein the guide member is substantially shaped as a rectangular prism with open ends corresponding to the connector element and the mating connector.

14. A connector comprising:

a connector element which is mounted to an object such that a connecting end portion of the connector element penetrates the object, so as to be connected to a mating connector in a predetermined direction; and a guide member fitted to an outside of the connecting end portion to receive the mating connector;

wherein the guide member comprises:

at least one engaging claw to engage with the connector element in the predetermined direction so as to fix the connector element to the object; and a spring portion which is provided on an inner surface of the guide member, which is adapted to be pressed by the mating connector in a radially outward direction, and which stabilizes the mating connector; and wherein the guide member is substantially shaped as a rectangular prism with open ends corresponding to the connector element and the mating connector.

* * * * *